United States Patent [19]

Asars et al.

[11] Patent Number: 5,032,795
[45] Date of Patent: Jul. 16, 1991

[54] DEFECT POSITION LOCATOR FOR CABLE INSULATION MONITORING

[75] Inventors: Juris A. Asars, Murrysville Boro; Gergory D. Matthews, Edgewood; Michael E. Golbaugh, Level Green, all of Pa.

[73] Assignee: Westinghouse Electric Corp., Pittsburgh, Pa.

[21] Appl. No.: 466,100

[22] Filed: Jan. 16, 1990

[51] Int. Cl.$^5$ .............................................. G01R 31/12
[52] U.S. Cl. .................................. 324/544; 324/557; 324/514
[58] Field of Search ............... 324/557, 558, 559, 527, 324/531, 541, 544, 501; 340/647, 651

[56] References Cited

U.S. PATENT DOCUMENTS

| | | | |
|---|---|---|---|
| 3,263,165 | 7/1966 | Eigen | 324/514 |
| 3,421,076 | 7/1969 | Eigen | 324/544 |
| 4,891,597 | 1/1990 | Asars | 324/557 |
| 4,931,684 | 6/1990 | Asars et al. | 324/541 |
| 4,950,957 | 8/1990 | Asurs et al. | 324/541 |

Primary Examiner—Kenneth A. Wieder
Assistant Examiner—Maura K. Regan

[57] ABSTRACT

A device for detecting insulation defects in a cable having a conductor while an electrical signal is impressed on the cable conductor, the device being composed of an ion source for generating an ion cloud and arranged for causing the ion cloud to be displaced along, and to envelop, the cable, a sense conductor arranged to be disposed along, and in proximity to, the cable and to be in communication with the ion cloud, and a plurality of coded position conductors arranged to be disposed along, and in proximity to, the sense conductor and to be in communication with the ion cloud, each position conductor having at least one discrete region covered with insulation arranged in a pattern which differs from one position conductor to another. An alternating signal having a respectively different frequency is applied to each position conductor, the frequency of the signal impressed on each position conductor being different from the frequency of the signal impressed on the cable conductor. When the ion cloud envelops the conductors and a region of the cable insulation which contains a defect, signals present in the cable conductor and the position conductors are coupled into the sense conductor. The signals impressed on the cable ocnductor and on each position conductor are synchronously detected with respect to the signals coupled into the sense conductor to provide an indication of the existence and location of cable insulation defects.

6 Claims, 1 Drawing Sheet

DEFECT POSITION LOCATOR FOR CABLE INSULATION MONITORING

FIELD OF THE INVENTION

The present invention relates to the methods and devices used to detect defects in the insulation around wires and cables. More particularly it relates to an insulation defect detector which utilizes synchronous detection.

BACKGROUND OF THE INVENTION

In certain situations and circumstances, it is important to know if the insulation surrounding a wire or cable has deteriorated. Such deterioration could be a precursor to a failure in an important system. For example, in jet fighter aircraft, wire chaffing and the resulting deterioration of the insulation are often precursors to failure. If the chaffing continues undetected, the cable may be severed or shorted to another cable with catastrophic results depending on the purpose of the cable. If the cable is used to control the rudder or aileron, severing or shorting of that cable could result in a loss of control of the aircraft and possibly a fatal crash. It would be desirable therefore to be able to detect deterioration of wire insulation before failure occurs. If insulation defects and deterioration are detected in a timely manner, the wire or cable could be replaced before a catastrophic failure occurs.

U.S. Pat. No. 3,096,478 discloses an apparatus for detecting non-uniformity in electrically insulated wires through the use of conductive gas electrodes. The electrodes consist of a tube or sleeve containing ionized air which establishes a direct current path through the defective insulation segment. In the apparatus disclosed in this patent, the cable must be placed inside the conductive gas electrode. The conductor of the cable itself must be grounded and the cable must be moved through the conductive gas electrode during the test, so that the system can be employed essentially only for testing cables prior to installation. A current or voltage of fixed magnitude as applied to the, or one, electrode and a fault indication is based on a change in current flow through the cable insulation.

U.S. Pat. No. 3,263,165 describes apparatus for detecting corona-producing cable insulation defects. For this purpose, a voltage gradient is established along the cable by electrodes containing an ionized gas, the voltage being sufficient to cause gaseous areas in the cable insulation to become ionized and produce high frequency radiation which is detected. The cable is advanced through the apparatus and does not itself conduct any signal. Here again, the cable must be tested prior to installation.

The systems disclosed in both of these references require the measurement of very small currents in the cable under test and require that the cable not be in an installed state. These requirements considerably limit the range of applications of such systems.

U.S. Pat. No. 3,639,831 discloses a method and apparatus for producing a directable, electrically conducting gas jet and detecting the presence of anomalies therein caused by insulators, conductors or semiconductors. The gas jet flows across a test zone and impinges upon a target anode which is maintained at a bias potential with respect to the cathode of the ionizing generator such as to cause an electrical current to flow between the anode and the cathode via the gas jet across the test zone. This device requires that the electrical current flow between the gas jet nozzle and the target anode be constant. Moreover, there is no provision for measuring anomalies which have their own potential or are carrying a current.

Allowed U.S. patent application Ser. No. 07/267,138, filed on Nov. 4, 1988, discloses devices for detecting cable insulation defects which utilize an ionized gas stream or cloud in a manner which differs fundamentally from the techniques described in the above-cited patents. These devices can be used to test installed cables which are connected in an electrical system and are carrying their normal signals.

The devices disclosed in U.S. patent application Ser. No. 07/267,138 include an ion source and at least one sense conductor, both disposed adjacent the cable to be tested while the latter is carrying a normal alternating voltage. According to one embodiment, the ion source is moved along the cable under test to produce a localized ion cloud forming a conductive region between the cable and a single sense conductor. When a cable insulation defect of sufficient severity is encountered by the ion cloud, the electric field produced by the signal on the cable conductor induces a corresponding signal on the sense conductor. This occurrence can be detected by performing synchronous detection of the sense wire signal with respect to the cable conductor signal. The location of an insulation defect can be determined by noting the position of the ion source at the moment when a synchronous detection output signal is being produced.

According to a second embodiment disclosed in the above-cited application, use is made of an extended ion source extending along a length of the cable under test to generate an ion cloud which is coextensive with the source, and three position sense conductors are disposed along the cable length and are coded with insulation segments which form, for example, a gray Code such that along each portion of the cable length the position sense conductors present a unique combination of insulated segments and bare wire. A cable insulation defect will induce a current in phase with the cable signal on those sense conductors which have bare portions opposite the location of the defect and the signal on each sense conductor can be synchronously detected with respect to the cable signal.

A major disadvantage of this technique is that each coded sense conductor will receive a relatively low current level signal which can be sensed only with difficulty, particularly when testing is carried out in the presence of higher level noise signals.

It has also been proposed to provide an extended ion source which produces a localized ion cloud that travels along the cable. This is achieved by dividing the source into several segments which are actuated in sequence. For example, individual ion sources can be activated in sequence by multi-phase ionizing burst conductors each connected to supply ionizing energy to a respective source. The number of identifiable locations for the localized ion cloud is equal to the number of source segments or burst conductor phases. Such ion sources are disclosed in pending U.S. patent application Ser. No. 267,150, filed on Nov. 4, 1988.

According to the disclosure of that application, the current in the cable under test is monitored to determine whether, when the ion source is activated, a current component appears in the cable conductor as a result of an insulation defect. The current component thus induced in the cable conductor will be of small magnitude and hence difficult to detect. In addition, the conductor under test must be disconnected from its associated circuit devices since a signal in the conductor would effectively mask the current resulting from an insulation defect.

SUMMARY OF THE INVENTION

It is a primary object of the present invention to provide a more readily detectable, and hence a more reliable, indication of the location, along the length of the cable, of a detected insulation defect.

A more specific object of the invention is to provide defect location signals in an environment containing high level noise signals.

Another object of the invention is to facilitate the use of an ion source producing a travelling ion cloud, particularly a manually displaceable ion source, by providing position information which is independent of the position or speed of displacement of the ion source along the cable section under test.

The above and other objects are achieved, according to the present invention, by a device for detecting insulation defects in a cable having a conductor while an electrical signal is impressed on the cable conductor, comprising:

an ion source for generating an ion cloud and arranged for causing the ion cloud to be displaced along, and to envelop, the cable;

a sense conductor arranged to be disposed along, and in proximity to, the cable and to be in communication with the ion cloud;

a plurality of coded position conductors arranged to be disposed along, and in proximity to, the sense conductor and to be in communication with the ion cloud, each position conductor having at least one discrete region covered with insulation arranged in a pattern which differs from one position conductor to another;

alternating signal generating means connected to the position conductors for impressing an alternating signal having a respectively different frequency on each position conductor, the frequency of the signal impressed on each position conductor being different from the frequency of the signal impressed on the cable conductor;

the sense conductor and the position conductors being arranged to be positioned relative to the ion source and the cable for causing the ion cloud to envelop the conductors, such that a signal present in the cable conductor is coupled into the sense conductor when the ion cloud envelops a region of the cable insulation which contains a defect, and the alternating signal impressed on each position conductor is coupled into sense conductor when the ion cloud envelops a region of the position conductor which is outside of at least one discrete region; and synchronous detector means connected to the sense conductor and the position conductors and arranged to be connected to the cable conductor for synchronously detecting the signal impressed on the cable conductor and the signal impressed on each of the position conductors by the alternating signal generating means with respect to the signals coupled into the sense conductor.

DESCRIPTION OF THE PREFERRED EMBODIMENTS

Figure 1:
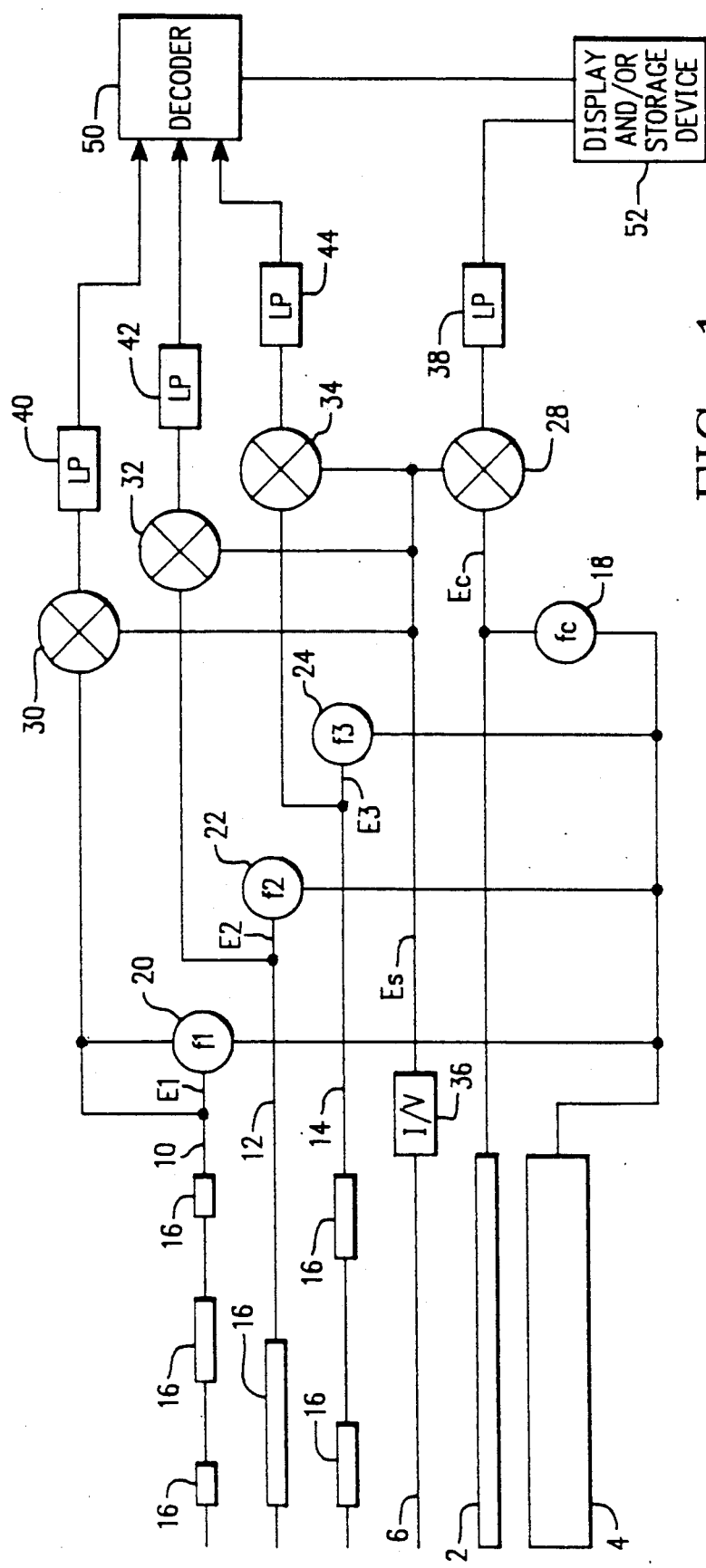
FIG. 1 is a partly pictorial, partly schematic view of a preferred embodiment of the system according to the invention.

The system according to the invention illustrated in FIG. 1 is intended for monitoring defects which may exist in the insulation of a cable 2.

For this purpose, the device according to the present invention includes an ion generator 4 constructed and operated to produce a localized ion cloud which is displaced so as to traverse the length of the portion of cable 2 which is being tested. A sense conductor 6, which is preferably constituted by a length of bare wire, is arranged to be disposed parallel, and in proximity to, cable 2, during a test.

In addition, a plurality of coded position conductors 10, 12 and 14 are arranged to be disposed parallel, and in proximity, to sense conductor 6 and ion generator 4. Each position conductor 10, 12 and 14 is provided with insulation 16 at one or more discrete locations along the portion of the conductor which will be opposite the portion of cable 2 which is to be tested.

For testing a length of cable 2, ion generator 4, sense conductor 6 and position conductors 10, 12 and 14 will be disposed so that the ion cloud produced by generator 4 envelops all of the remaining components in a localized region along the length of cable 2. The ion cloud represents a conductive gaseous region which will allow an electric field generated by the conductor of cable 2 or by any one of position conductors 10, 12 and 14 to be coupled into sense wire 6 in a manner dependent on the state of the insulation surrounding either the conductor of cable 2 or any one of the position conductors. Specifically, the insulation surrounding any one of these conductors will determine the phase relation between the voltage present on the conductor of cable 2 or conductor 10, 12 or 14, on the one hand, and the resulting current induced in sense conductor 6. The degree of insulation will also have some influence on the amplitude of the current induced in sense conductor 6.

For testing purposes, an alternating signal, $E_c$, preferably having a fixed frequency, $f_c$, is impressed on the conductor of cable 2 by a signal generator 18 and fixed frequency signals $E_1$, $E_2$ and $E_3$, at fixed frequencies $f_1$, $f_2$ and $f_3$, respectively, are impressed on position conductors 10, 12 and 14, respectively, by signal generators 20, 22 and 24, respectively.

Each of these signals is further supplied to an input of a respective one of synchronous detectors 28, 30, 32 and 34. Each of these synchronous detectors is further connected to receive a signal $E_s$ produced by a current/voltage converter 36 connected to receive the current induced in sense conductor 6.

Each synchronous detector operates essentially as a multiplier to produce an output proportional to the product of the instantaneous magnitudes of the two signals supplied thereto.

The output of each of detectors 28, 30, 32 and 34 is connected to a respective one of lowpass filters 38, 40, 42 and 44. The output from each lowpass filter is substantially a unidirectional voltage having the following form:

OUTPUT = $|E_s| \cdot |E_i| \cdot \cos \alpha$, where i = c, 1, 2 or 3 and,
$\alpha$ is the phase angle between $E_s$ and $E_i$.

In the case of the output from filter 38, the value of $\alpha$ will be representative of the state of the insulation of cable 2 at the location of the ion cloud, the magnitude of $\alpha$ varying directly or inversely with the magnitude of any insulation defect present at that location.

In the case of the outputs from filters 40, 42 and 44, $\alpha$ will vary between two clearly distinguishable values, depending on whether the ion cloud is enveloping a region occupied by insulation 16 or a bare conductor region. Therefore, the magnitude of the output signal from each of filters 40, 42 and 44 will vary between a first value associated with a conductor section covered with insulation 16 and a second value associated with a bare conductor section.

As can be seen from FIG. 1, insulation 16 is arranged so that the outputs of filters 40, 42 and 44 will constitute elements of a gray code, and these outputs are supplied to a decoder 50 which produces an output signal indicative of the instantaneous location of the ion cloud along the length of conductors 10, 12 and 14, and hence along the length of cable 2.

Correspondingly, when the ion cloud envelops a region of cable 2 where an insulation defect having a certain severity is present, the output of filter 38 will vary above or below a selected threshold value.

The output of filter 38 and the output signal from decoder 50 may be supplied to a display and/or storage device 52, which may be a digital data processing system constructed according to principles known in the art to coordinate the signals supplied thereto in order to provide cable insulation defect indications with associated position representations.

By way of example, and using conventional practices in the art, the output from filter 38 could be sampled at a rate sufficiently high to assure that one or more samples are derived for each incremental region of cable 2, each incremental region being associated with a certain combination of insulated and bare sections of conductors 10, 12 and 14, with each sample being associated with the position value represented by the contemporaneous output signal from decoder 50. If several samples are obtained while the output signal from decoder 50 has a particular value, the maximum or minimum sample value could be selected, or all of the sample values could be averaged. Use of the maximum or minimum sample value will serve to increase the effective sensitivity of the system, while averaging will serve to eliminate the effects of spurious sample signals. One technique or the other may prove preferable in a particular situation, or with particular hardware.

Then, the resulting stored values, with each signal indicative of the state of the insulation of cable 2 being associated with a position signal, could be employed to produce a recording or display indicative of the state of the cable section under investigation. The display could, for example, be in the form of a trace which is controlled vertically by the samples derived from the output of filter 38 and horizontally by the signals produced by decoder 50. Other forms of display and recording could be produced in accordance with techniques well known in the art.

The use of synchronous detection of each of the signals produced by generators 18, 20, 22 and 24 with respect to the signals coupled into sense wire 6 produces outputs having an improved signal/noise ratio and less sensitive to high level noise signals which may be present.

Ion generator 4 could be constituted by an extended ion source having the form disclosed in the above-cited pending U.S. patent application Ser. No. 267,150, filed on Nov. 4, 1988. This source could be constituted by several separate segments, each constituting an individually controllable ion generator, spaced apart along the length of the cable under test and sequentially excited to cause an ion cloud to be displaced along the length of the cable. Alternatively, as shown in FIGS. 4-6 of that application, such ion generator could be a device provided with a plurality of ionizing burst conductors connected to a plural phase signal source which supplies an ion generating potential to each burst conductor in turn.

When the ion generator has one of the forms described above, its longitudinal position relative to cable 2 need not be set with a high degree of accuracy because accurate insulation defect position information will be provided by conductors 10, 12 and 14.

Figure 2:
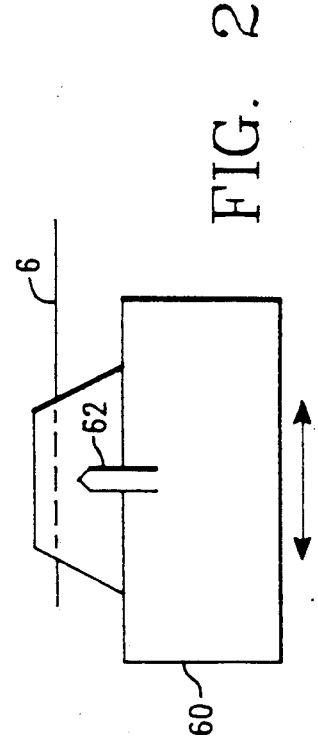
FIG. 2 is a simplified pictorial view of a manually displaceable ion source which can be employed in the system of FIG. 1.

In further accordance with the invention, the ion generator could be constituted by a manually movable device producing a localized ion cloud. One such device is shown in FIG. 2 as device 60 provided with a component 62 generating an ion stream. In this embodiment, device 60 carries sense conductor 6 since that conductor need only be located in the region of the ion cloud.

The improvements offered by the present invention are particularly advantageous when the ion generator has the form shown in FIG. 2 because the system according to the invention will produce an accurate indication of the position of the ion cloud along the length of cable 2 regardless of the speed, uniformity or direction of displacement of device 60 along the length of cable 2.

Devices according to the invention could also be employed to simultaneously test a plurality of cables. If each cable is carrying a detectably different signal, it would be possible to directly identify that cable which possesses an insulation defect. The conductor of each cable would be connected to a respective synchronous detector and the signal from each synchronous detector could be associated with the position signal from decoder 50.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A device for detecting insulation defects in a cable having a conductor while an electrical signal is impressed on the cable conductor, comprising:

an ion source for generating an ion cloud and arranged for causing the ion cloud to be displaced along, and to envelop, the cable;

a sense conductor arranged to be disposed along, and in proximity to, the cable and to be in communication with the ion cloud;

a plurality of coded position conductors arranged to be disposed along, and in proximity to, said sense conductor and to be in communication with the ion cloud, each said position conductor having at least one discrete region covered with insulation arranged in a pattern which differs from one position conductor to another;

alternating signal generating means connected to said position conductors for impressing an alternating signal having a respectively different frequency on each said position conductor, the frequency of the signal impressed on each said position conductor being different from the frequency of the signal impressed on the cable conductor;

said sense conductor and said position conductors being arranged to be positioned relative to said ion source and the cable for permitting the ion cloud to envelop said conductors, such that a signal present in the cable conductor is coupled into said sense conductor when the ion cloud envelops a region of the cable insulation which contains a defect, and the alternating signal impressed on each said position conductor is coupled into said sense conductor when the ion cloud envelops a region of said position conductor which is outside of said at least one discrete region; and synchronous detector means connected to said sense conductor and said position conductors and arranged to be connected to the cable conductor for synchronously detecting the signal impressed on the cable conductor and the signal impressed on each of said position conductors by said alternating signal generating means with respect to the signals coupled into said sense conductor.

2. A device as defined in claim 1 wherein said synchronous detector means comprise a plurality of synchronous detector units each connected to receive a first input signal proportional to the signals coupled into said sense conductor and a respective one of the signals impressed on the cable conductor and on said position conductors for producing an output signal proportional to the product of the amplitudes of the signals received by said unit and the phase angle between those signals.

3. A device as defined in claim 2 further comprising indicator means connected to receive the output signals produced by said units for providing a visual indication of the location of cable insulation defects along the cable.

4. A device as defined in claim 1 wherein said coded position conductors are covered with insulation in a pattern constituting a binary gray code each bit of which is represented by a respective position conductor.

5. A device as defined in claim 1 wherein said ion source is an extended source for producing a localized ion cloud which is displaceable along the length of said source.

6. A device as defined in claim 1 wherein said ion source is a portable, hand-held source for producing a localized ion cloud.

* * * * *